United States Patent [19]

Fuse et al.

[11] 4,284,998

[45] Aug. 18, 1981

[54] JUNCTION TYPE FIELD EFFECT TRANSISTOR WITH SOURCE AT OXIDE-GATE INTERFACE DEPTH TO MAXIMIZE $\mu$

[75] Inventors: Noboru Fuse, Kitakyushu; Kenichi Muramoto, Kawasaki; Keizo Tani; Masaaki Iwanishi, both of Tokyo, all of Japan

[73] Assignee: Tokyo Shibaura Electric Co., Ltd., Japan

[21] Appl. No.: 937,570

[22] Filed: Aug. 28, 1978

Related U.S. Application Data

[63] Continuation of Ser. No. 768,942, Feb. 15, 1977, abandoned.

[30] Foreign Application Priority Data

Feb. 18, 1976 [JP] Japan .................................. 51-15844

[51] Int. Cl.³ .............................................. H01L 29/80
[52] U.S. Cl. ............................................ 357/22; 357/20
[58] Field of Search ................................... 357/22, 20

[56] References Cited

U.S. PATENT DOCUMENTS

| 3,414,782 | 12/1968 | Lin et al. | 357/22 |
| 3,497,777 | 2/1970 | Teszner | 357/22 |
| 3,814,995 | 6/1974 | Teszner | 357/22 |
| 3,977,017 | 8/1976 | Ishitani | 357/22 |
| 3,982,264 | 9/1976 | Ishitani | 357/22 |

FOREIGN PATENT DOCUMENTS 7510282  3/1976  Netherlands .............................. 357/22

Primary Examiner—Joseph E. Clawson, Jr.
Attorney, Agent, or Firm—Finnegan, Henderson, Farabow, Garrett & Dunner

[57] ABSTRACT

A junction type field effect transistor comprises a semiconductor layer of one conductivity type acting as a drain region, a source region of said one conductivity type formed to a prescribed depth from the surface of the semiconductor layer, an insulation layer formed to a prescribed depth from the surface of the semiconductor layer to surround the source region, and a gate region of the opposite conductivity type formed in the proximity of the sorce region. The insulation layer and source region are formed to substantially the same depth.

13 Claims, 8 Drawing Figures

JUNCTION TYPE FIELD EFFECT TRANSISTOR WITH SOURCE AT OXIDE-GATE INTERFACE DEPTH TO MAXIMIZE μ

This is a continuation of application Ser. No. 768,942, filed Feb. 15, 1977, now abandoned.

BACKGROUND OF THE INVENTION

I. Field of the Invention

This invention relates to a junction type field effect transistor (abbreviated as "J-FET"), and more particularly to a multichannel type vertical J-FET displaying a triode characteristic.

II. Description of the Prior Art

To date, various forms of power supply type vertical J-FET have been proposed. However, the proposed J-FET's are accompanied with drawbacks, though possessed of some merits.

For instance, the Japanese Patent Application Publication No. 84181 (laid open to public on July 7, 1975) sets forth a J-FET admitting of an easy control of the width and depth of a channel section on which the property of the J-FET largely depends. The proposed J-FET comprises a semiconductor layer of one conductivity type and a plurality of annular insulation layers formed by selective oxidation to a prescribed depth from the surface of the semiconductor layer. A gate region of the opposite conductivity type to the semiconductor layer is formed in the semiconductor layer between the respective adjacent annular insulation layers. A source region is formed in that portion of the semiconductor layer which is surrounded by each annular insulation layer.

With the above-mentioned J-FET in which a source region is surrounded by an annular insulation layer, the depth and width of a channel section formed under the source region between the adjacent gate regions are defined only by the depth to which an impurity is diffused to constitute the gate region. The proposed J-FET is characterized by the structure in which the source region has a smaller depth than the annular insulation layer. It is assumed from this fact that said J-FET is devised to elevate a withstand voltage across the source and gate regions in view of a fully large space allowed between the source and gate regions.

From the property of a triode, however, the proposed J-FET cannot be regarded to have a fully satisfactory structure. Generally, a transistor can display a good triode property when a curve representing the voltage-current characteristic of the transistor is prevented as much as possible from presenting a saturated state. However, the proposed J-FET has the drawbacks that the voltage-current curve indicates a saturated state relatively early and moreover gate-leakage current increases.

SUMMARY OF THE INVENTION

It is accordingly the object of this invention to provide a junction type field effect transistor which indicates little gate-leakage current and a high voltage-amplifying degree performing an excellent property as a triode.

According to an aspect of this invention, there is provided a junction type field effect transistor comprising:

a drain region formed of a semiconductor layer of one conductivity type;

a source region constituted by a first layer of one conductivity type which is formed to a prescribed depth from the surface of the semiconductor layer at a high concentration of impurity;

an insulation layer formed in the semiconductor layer to substantially the same depth at least from the surface of the semiconductor layer so as to closely surround the source region; and a gate region constituted by a second layer of the opposite conductivity type to the semiconductor substrate which is formed in the semiconductor layer to a prescribed depth from the underside of the insulation layer so as to extend from the proximity of the source region to the corresponding edge of the semiconductor substrate.

DETAILED DESCRIPTION OF THE PREFERRED EMBODIMENT

Figure 1:
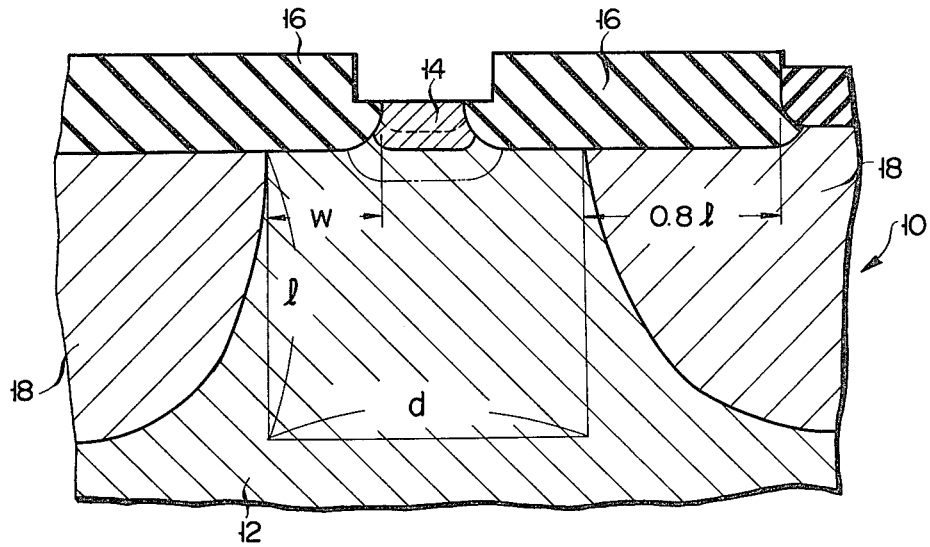
FIG. 1 is a cross sectional view of the main part of a junction type field effect transistor embodying this invention.

There will now be described by reference to the appended drawings a junction type field effect transistor (abbreviated as "J-FET") embodying this invention. Throughout the drawings, the same parts are denoted by the same numerals. As shown in FIG. 1, the J-FET 10 of this invention comprises a semiconductor layer 12 constituting a drain region in which various semiconductor regions are formed. A first layer 14 of one conductivity type acting as a source region is formed at a high concentration of impurity to a prescribed depth from the surface of the semiconductor layer 12. An annular insulation layer 16 is formed in the semiconductor layer 12 to surround the source region 14 to substantially the same depth as the source region 14 and generally has a greater height than the source region 14. Gate regions 18, 18 each constituted by a second semiconductor layer of the opposite conductivity type to the semiconductor substrate are formed in the semiconductor layer 12 to a prescribed depth from the underside of the insulation layer 16 so as to extend from the proximity of the source region 14 to the corresponding edge of the semiconductor substrate. A channel is to be formed between the gate regions 18, 18. Since a withstand voltage across the source and gate regions 14, 18 is generally required to be about 40 volts, a space w between the source region 14 and each gate region 18 has to be at least about 1.3 microns.

A channel formed between the gate regions 18, 18 is preferred to have a depth l (a distance between the underside of the insulation layer 16 and that of the gate regions 18) which is one to one and a half fold larger than the width d of said channel (a distance between those points at which the peripheral edges of the regions 18, 18 contact the underside of the insulation layer 16). A desired width d of the channel may be calculated from the following equation.

$$d = \sqrt{\frac{8K_s\epsilon_0(V_G + \phi B)}{qN_D}}$$

where:

$K_s$=dielectric constant
$\epsilon_o$=permitivity of free space
$V_G$=gate voltage
$\phi B$=built-in voltage
q=magnitude of electronic charge
$N_D$=impurity concentration The channel is generally chosen to have a width d of about 4 to 7 microns.

Figure 2A:
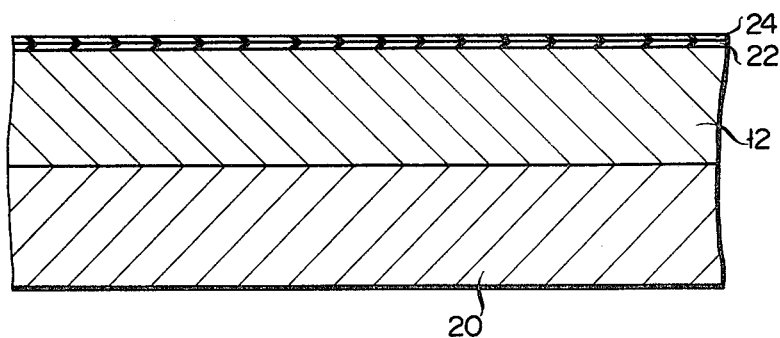
FIGS. 2A to 2G illustrate the sequential steps of manufacturing a junction type field effect transistor according to this invention.

The J-FET of this invention is manufactured through the steps shown in FIGS. 2A to 2G. As illustrated in FIG. 2A, an N-type silicon layer 12 is epitaxially grown at a low impurity concentration of $1\times10^{14}$ to $1\times10^-$ atoms/cm$^3$ on an N-type silicon substrate 20 of low resistivity or high impurity concentration. A silicon oxide film 22 is formed on the silicon layer 12 to a thickness of about 1000 to 1500 A. Further, a silicon nitride ($Si_3N_4$) film 24 is formed by chemical vapor deposition (abbreviated as "CVD") on the silicon oxide film 22 sufficiently thin, namely, to a thickness of about 1000 A in order to prevent the occurrence of deteriorations of crystalline structure in an interface between the silicon layer 12 and silicon oxide film 22 during the subsequent heat treatment. The silicon layer 12 can be provided, instead of epitaxial growth, by diffusing an impurity of the same conductivity type as the silicon substrate of high resistivity in both walls of said silicon substrate at high concentration and removing the impurity layer diffused in one of the walls of the substrate by, for example, grinding.

Figure 2B:
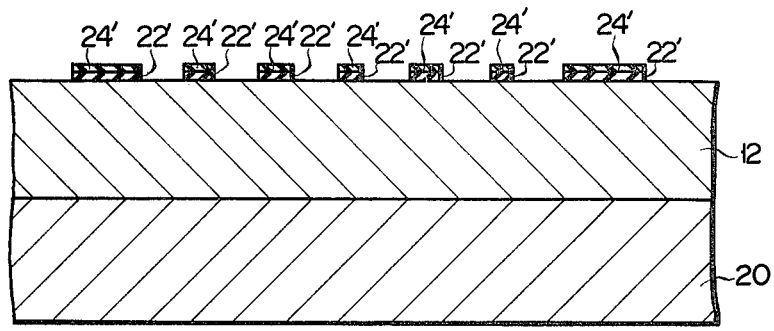

As shown in FIG. 2B, holes are bored by photo etching through the silicon nitride film 24 and silicon oxide film 22 in prescribed places. In this case, the silicon nitride film 24 may be etched by a plasma of freon gas. Or it is possible to deposit a fresh silicon oxide film all over the silicon nitride film 24, bore a hole by photo etching in the prescribed places of said fresh silicon oxide film, and etch the silicon nitride film 24 by hot phosphoric acid with the remaining silicon oxide film used as a mask. Thereafter, the silicon oxide film 22 is etched with the remaining portions of the silicon nitride film 24' used as a mask to expose the surface of the epitaxially grown silicon layer 12.

Figure 2C:
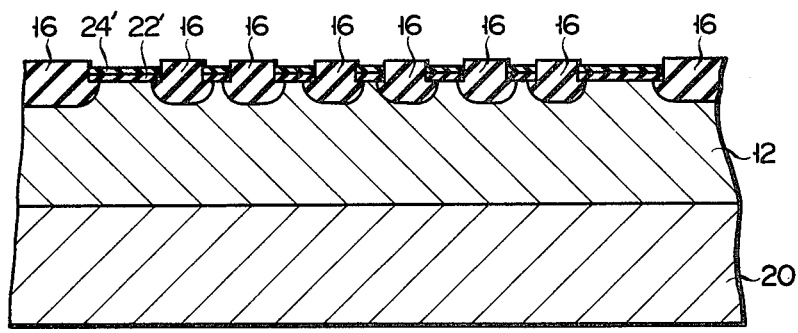

As indicated in FIG. 2C, the silicon layer 12 is subjected to high temperature oxidation with the remaining portions of the silicon nitride film 24' used as a mask to form a silicon oxide layer 16 to a thickness of about 10,000 to 15,000 A. At this time, those portions of the silicon nitride film 24' each used as a mask is not oxidized, because said mask is impermeable to oxygen.

The silicon oxide layer 16 provided by the above-mentioned high temperature oxidation or selective oxidation is buried in the silicon layer 12 to an extent corresponding to about 45% of the thickness thereof, i.e., about 10,000 to 15,000 A. Namely, an interface between the silicon oxide layer 16 and the underlying silicon layer 12 is shifted downward to an extent of about 5,000 to 7,000 A from the original surface of the silicon layer 12 before the high temperature oxidation was applied. The high temperature oxidation may be regarded as a sort of oxygen-diffusing process. Since oxygen is horizontally diffused, those portions of the silicon layer 12 which lie under the peripheral edge of the silicon nitride film 24 are also slightly oxidized.

Figure 2D:
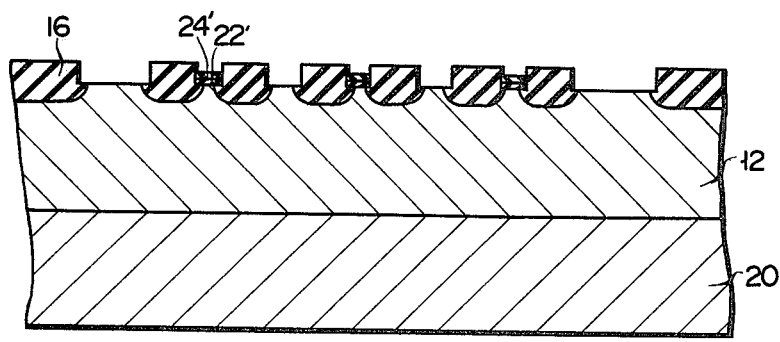

As seen from FIG. 2D, the remaining portions of the silicon nitride film 24' and those of the underlying silicon film 22' jointly occupying a prescribed position are removed in the annular form by plasma etching and chemical etching using ammonium fluoride ($NH_4F$) respectively to expose the surface of the underlying silicon layer 12.

Figure 2E:
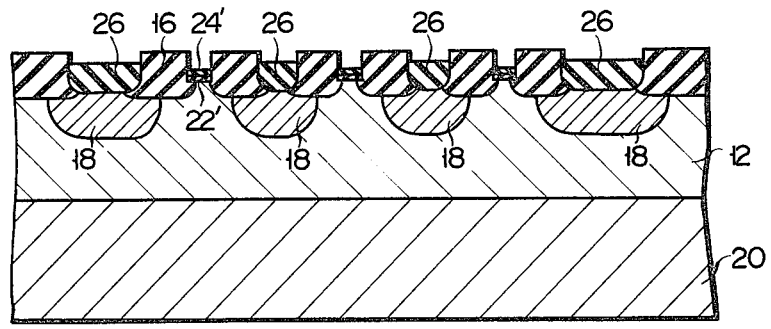

Referring to FIG. 2E, a P-type impurity, for example, boron is diffused from the exposed surface of the silicon layer 12 by the boron nitride process or the previously described CVD process at a concentration of about $1\times10^{19}$ to $5\times10^{19}$ atoms/cm$^3$ to form the gate region 18 to a prescribed depth so as to surround the source region 14. Thereafter a silicon oxide film 26 is deposited on the gate region 18. The formation of the gate region 18 and silicon oxide film 26 is carried out by the following process. Namely, boron is diffused in the silicon layer 12 to a prescribed depth from borosilicate glass used as a source of diffusion. Thereafter, a silicon oxide film 26 is formed on the exposed portions of the surface of the silicon layer 12 by the aforesaid high temperature oxidation to a thickness of about 10,000 A. At the same time, the gate region 18 is provided by diffusing boron to a prescribed depth by heat treatment applied at this time. Or after boron is diffused to a prescribed depth to form the gate region 18, the silicon oxide film 26 may be formed by removing those portions of the silicon oxide layer 16 which are deposited on the silicon layer 12 by a silicon oxide-etching solution hardly dissolving silicon nitride, for example, a solution of ammonium fluoride and thereafter oxidizing all those portions of the silicon layer 12 which are freed of the silicon nitride film 24'.

At this time, boron is diffused, as best shown in FIG. 1, horizontally under the silicon oxide layer 16 to an extent corresponding to 0.8 fold of the depth of the gate region 18 constituted by the boron.

Figure 2F:
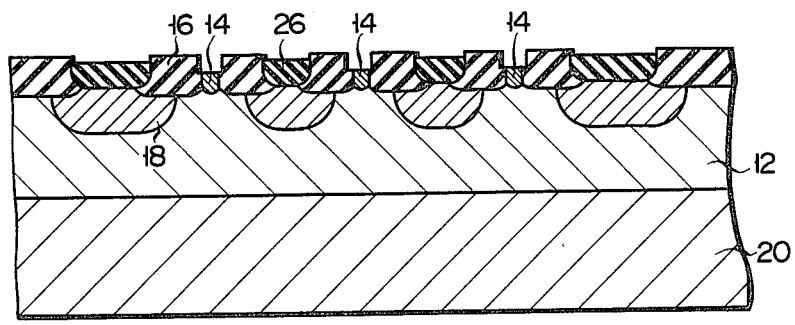

In the step of FIG. 2F, the remaining portions of the silicon nitride film 24' are removed by chemical etching using hot phosphoric acid or plasma etching. Further, the remaining portions of the silicon oxide film 22' are taken off by, for example, ammonium fluoride. An N-type impurity is diffused from the resultant opening at a high concentration of $5\times10^{19}$ to $3\times10^{20}$ atoms/cm$^3$ to form the source region 14 to substantially the same depth as that to which the silicon oxide layer 16 is formed in the silicon layer 12.

The depth of the source region 14 exerts an important effect on the capacity of the J-FET to display a good triode property. This reason will now be described by reference to FIG. 1, with the case where the source region 14 and insulation layer 16 have the same depth, taken as the base.

First, discussion is made of the case where the source region 14 has a smaller depth (as indicated by a broken line) than the insulation layer 16. In this case, a source resistance $R_s$ increases, as naturally expected, decreasing drain saturation current $I_{DSS}$ inversely proportional to the source resistance $R_s$. Namely, a curve denoting voltage-current characteristic presents a saturated state relatively early, proving that such J-FET is not acceptable as a triode. Another problem with the above-mentioned case is that since the insulation layer 16 is formed by selective oxidation, noticeable crystalline deformations appear on that portion of the surface of the semiconductor layer 12 which is surrounded by the insulation layer 16. In other words, if made shallow, the source region 14 which is placed on the above-mentioned defective portion of the surface of the semiconductor layer 12 gives rise to the occurrence of a large amount of gate-leakage current.

In another case where the source region 14 has a larger depth than the insulation layer 16 (as shown by a dot-dash line), the formation of a channel is restricted to the extent corresponding to the excess depth of the source region 14 over that of the insulation layer 16, resulting in a decline in a voltage-amplifying degree $\mu$. Further, said excess depth has a horizontal expansion to decrease a withstand voltage $V_{GSO}$ across the source region 14 and gate region 18.

In contrast to the above-mentioned two cases, the J-FET of this invention in which the source region 14 has substantially the same depth as the insulation layer 16 is saved from the drawbacks of said two cases. Namely, the J-FET of the invention indicates a relatively large amount of drain saturation current, and a far smaller amount of gate-leakage current than has been experienced in the past, elevates a voltage-amplifying degree and improves a withstand voltage across the source region 14 and gate region 18.

Figure 2G:
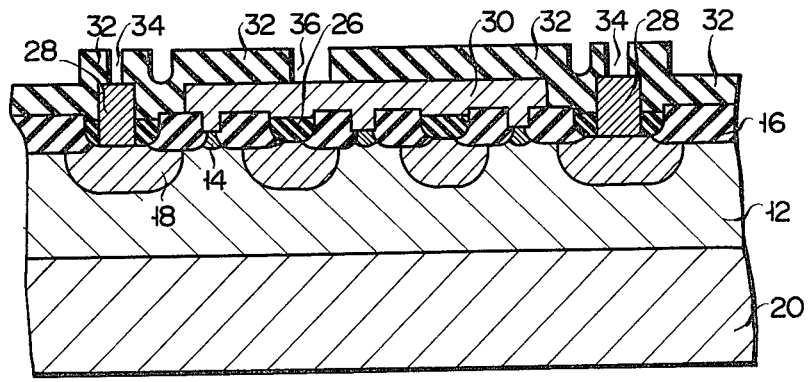

After the required semiconductor regions are formed as described above, the silicon oxide film 26 is bored in the specified places to provide gate electrodes 28. At this time, a source electrode 30 is also formed by utilizing a hole in which the source region 14 is diffused, thereby eliminating the necessity of boring a fresh hole. Later, a layer of phosphosilicate glass 32 for passivation is coated, as shown in FIG. 2G, all over the surface of the semiconductor device by means of the CVD process. Lead holes 34, 36 are provided to connect the source region 14 and gate region 18 respectively to external electrodes.

After the formation of the gate region 18, the J-FET of this invention is not subjected to high temperature treatment except when the source region 14 is provided. Therefore, the gate region 18 remains little changed in shape, enabling the subject J-FET having a triode property defined by a ratio between the width d and depth l of the channel section to be manufactured with a high reproducibility. Further, the ratio between the width d and depth l of the channel section is easily controlled only by the depth to which the gate region 18 18 is diffused, thus offering great convenience.

What is claimed is:

1. A junction type field effect transistor comprising:
   a drain region formed of a semiconductor layer of one conductivity type;
   a source region constituted by a first layer of said one conductivity type which is formed to a prescribed depth from the surface of the semiconductor layer at a high concentration of impurity;
   an insulation layer formed in the semiconductor layer closely around the source region, with said source region being sufficiently deep with respect to said insulation layer, at least from the surface of said semiconductor layer, to establish triode voltage-current characteristics, and said source region being formed sufficiently shallow with respect to said insulation layer, at least from the surface of said semiconductor layer, to maximize voltage-amplifying degree $\mu$; and
   a gate region constituted by a second layer of the opposite conductivity type to the semiconductor layer which is formed in the semiconductor layer to a prescribed depth from the underside of the insulation layer so as to extend from the proximity of the source region away from the source region.

2. The junction type field effect transistor according to claim 1, wherein the gate region surrounds the source region.

3. The junction type field effect transistor according to claim 2, wherein the distance between a first plane defined by the underside of the insulation layer and a second plane defined by the underside of the gate region is one to one and a half fold of the distance between third and fourth planes which are parallel to each other and are perpendicular to said first and second planes, with said third and fourth planes intersecting a common junction of said drain region, gate region, and insulation layer on opposite sides of said source region.

4. The junction type field effect transistor according to claim 1, wherein the impurity concentration of the source region ranges from $5 \times 10^{19}$ to $3 \times 10^{20}$ atoms/cm$^3$.

5. The junction type field effect transistor according to claim 1, wherein the impurity concentration of the gate region ranges from $1 \times 10^{19}$ to $5 \times 10^{19}$ atoms/cm$^3$.

6. The junction type field effect transistor according to claim 1, wherein the impurity concentration of the semiconductor layer ranges between $1 \times 10^{14}$ and $1 \times 10^{15}$ atoms/cm$^3$.

7. The junction type field effect transistor according to claim 1, wherein the source region has a depth of 5,000 to 7,000 Å.

8. A junction type field effect transistor comprising:
   a drain region formed of an N-type semiconductor layer having an impurity concentration of $1 \times 10^{14}$ to $1 \times 10^{15}$ atoms/cm$^3$;
   a source region constituted by an N-type layer formed to a depth of 5,000 to 7,000 Å from the surface of the semiconductor layer at an impurity concentration of $5 \times 10^{19}$ to $3 \times 10^{20}$ atoms/cm$^3$;
   an insulation layer surrounding the source region and formed in the semiconductor layer closely around the source region, with said source region being sufficiently deep with respect to said insulation layer, at least from the surface of the semiconductor layer, to establish triode voltage-current characteristics and said source region being formed sufficiently shallow with respect to said insulation layer, at least from the surface of the semiconductor layer, to maximize voltage-amplifying degree $\mu$; and
   a gate region constituted by a P-type layer having an impurity concentration of $1 \times 10^{19}$ to $5 \times 10^{19}$ atoms/cm$^3$ which is formed in the semiconductor layer to a prescribed depth from the underside of the insulation layer so as to be laterally displaced from said source region at least 1.3 microns and extending away from the source region to surround that portion of the semiconductor layer in which the source region is formed, and wherein a distance l between a first plane defined by the underside of the insulation layer and a second plane defined by the underside of the gate region is one to one and a half fold of a distance d between third and fourth planes which are parallel to each other and are perpendicular to said first and second planes, with said third and fourth planes intersecting a common junction of said drain region, gate region, and insulation layer on opposite sides of said source region.

9. The junction type field effect transistor according to claim 8, wherein the distance d is about 4 to 7 microns.

10. A junction type field effect transistor comprising:
    a drain region formed of an N-type semiconductor layer having an impurity concentration of $1 \times 10^{14}$ to $1 \times 10^{15}$ atoms/cm$^3$;
    a source region constituted by an N-type layer formed to a depth of 5,000 to 7,000 Å from the surface of the semiconductor layer at an impurity concentration of $5\times10^{19}$ to $3\times10^{20}$ atoms/cm$^3$;

an insulation layer surrounding the source region and formed in the semiconductor layer closely around the source region to the same depth as the source region at least from the surface of the semiconductor layer; and a gate region constituted by a P-type layer having an impurity concentration of $1\times10^{19}$ to $5\times10^{19}$ atoms/cm$^3$ which is formed in the semiconductor layer to a prescribed depth from the underside of the insulation layer so as to be laterally displaced from said source region at least 1.3 microns and extending away from the source region to surround that portion of the semiconductor layer in which the source region is formed and wherein a distance l between a first plane defined by the underside of the insulation layer and a second plane defined by the underside of the gate region is one to one and a half fold of a distance d between third and fourth planes which are parallel to each other and are perpendicular to said first and second planes, with said third and fourth planes intersecting a common junction of said drain region, gate region, and insulation layer on opposite sides of said source region.

11. The junction type field effect transistor according to claim 10, wherein the distance d is about 4 to 7 microns.

12. The junction type field effect transistor according to claim 1 wherein said insulation layer formed in said semiconductor layer closely around the source region is formed in said semiconductor region to substantially the same depth as the source region at least from the surface of said semiconductor layer.

13. The junction type field effect transistor according to claim 8 wherein said insulation layer formed in said semiconductor layer closely around the source region is formed in said semiconductor region to substantially the same depth as the source region at least from the surface of said semiconductor layer.

* * * * *